US012689198B1

(12) United States Patent
Michalek

(10) Patent No.: US 12,689,198 B1
(45) Date of Patent: Jul. 21, 2026

(54) ELECTRICAL POST FOR USE WITH A POOL

(71) Applicant: Randall Michalek, Suffield, CT (US)

(72) Inventor: Randall Michalek, Suffield, CT (US)

(*) Notice: Subject to any disclaimer, the term of this patent is extended or adjusted under 35 U.S.C. 154(b) by 755 days.

(21) Appl. No.: 18/121,055

(22) Filed: Mar. 14, 2023

(51) Int. Cl.
| *H02G 3/08* | (2006.01) |
| *E04H 4/12* | (2006.01) |
| *E04H 4/14* | (2006.01) |
| *H04R 1/02* | (2006.01) |
| *H05K 5/02* | (2006.01) |

(52) U.S. Cl.
CPC ............. *H02G 3/088* (2013.01); *E04H 4/129* (2013.01); *E04H 4/148* (2013.01); *H04R 1/028* (2013.01); *H05K 5/0217* (2013.01); *H05K 5/0247* (2013.01)

(58) Field of Classification Search
CPC .......... H02G 3/08; H02G 3/081; H02G 3/088; H02G 3/14; H02G 3/121; H02G 3/18; H05K 5/00; H05K 5/02; H05K 5/0217; H05K 5/0247; E04H 4/129; E04H 4/148; H04R 1/028; H01R 13/5213; H01R 13/717
USPC ............... 174/50, 37, 60, 53, 57, 58, 38, 39; 220/3.2, 3.3, 3.8, 4.02; 248/906
See application file for complete search history.

(56) References Cited

U.S. PATENT DOCUMENTS

| 4,519,657 | A | | 5/1985 | Jensen | |
| 4,546,418 | A | * | 10/1985 | Baggio | H02B 1/50 |
| | | | | | 362/85 |
| 4,785,376 | A | * | 11/1988 | Dively | H02B 1/50 |
| | | | | | 137/356 |
| 5,184,279 | A | * | 2/1993 | Horn | H02G 9/10 |
| | | | | | 362/85 |
| 5,696,493 | A | | 12/1997 | Einck | |
| 6,585,221 | B1 | | 7/2003 | Gretz | |
| 6,667,437 | B2 | | 12/2003 | Schenk | |
| 7,218,511 | B1 | | 5/2007 | Strozyk | |
| 7,361,832 | B2 | * | 4/2008 | Dively | H02G 3/0493 |
| | | | | | 174/37 |
| 7,807,924 | B2 | * | 10/2010 | Wurzer | H02G 3/0493 |
| | | | | | 174/45 R |
| 8,089,747 | B2 | * | 1/2012 | Storck | H02G 3/0493 |
| | | | | | 174/59 |
| 9,048,636 | B2 | | 6/2015 | Borden | |

(Continued)

FOREIGN PATENT DOCUMENTS

| CA | 2947194 | 6/2017 |

*Primary Examiner* — Angel R Estrada
(74) *Attorney, Agent, or Firm* — Kyle A. Fletcher, Esq.

(57) ABSTRACT

The electrical post for use with a pool includes an enclosure, a control switch, a timer, an AC outlet, and a GFCI breaker. The electrical post may be configured for use with a swimming pool, pool equipment, or both. As non-limiting examples, the pool equipment may include a pool pump, one or more pool lights, a pool heater, an outdoor audio system, a pool safety alarm, a device plugged into the AC outlet, or any combination thereof. The enclosure may be a square post rising from the ground and electrically coupled to the pool equipment. Some of the pool equipment may be coupled to the enclosure via underground wiring. The timer, the control switch, the AC outlet, and the GFCI breaker may be mounted to side walls of the enclosure and may be accessible from outside of the enclosure.

20 Claims, 7 Drawing Sheets

(56)         References Cited

U.S. PATENT DOCUMENTS

| 11,710,953 B2 * | 7/2023 | Smith | ................. H02G 3/0493 |
| | | | 174/67 |
| 2006/0032184 A1 | 2/2006 | Almeter | |
| 2006/0066152 A1 | 3/2006 | Klabunde | |

* cited by examiner

ELECTRICAL POST FOR USE WITH A POOL

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the fields of swimming pool accessories and electrical control panels, more specifically, an electrical post for use with a pool.

SUMMARY OF INVENTION

The electrical post for use with a pool comprises an enclosure, a control switch, a timer, an AC outlet, and a GFCI breaker. The electrical post may be configured for use with a swimming pool, pool equipment, or both. As non-limiting examples, the pool equipment may comprise a pool pump, one or more pool lights, a pool heater, an outdoor audio system, a pool safety alarm, a device plugged into the AC outlet, or any combination thereof. The enclosure may be a square post rising from the ground and electrically coupled to the pool equipment. Some of the pool equipment may be coupled to the enclosure via underground wiring. The timer, the control switch, the AC outlet, and the GFCI breaker may be mounted to side walls of the enclosure and may be accessible from outside of the enclosure.

An object of the invention is to provide a post that may be mounted into the ground near a pool.

Another object of the invention is to provide a control switch, a timer, an AC outlet, and a GFCI breaker mounted on the post and accessible to a user on the outside of the post.

A further object of the invention is to provide a removable top cap with lighting.

Yet another object of the invention is to provide a heater control and a heater breaker on the post.

These together with additional objects, features and advantages of the electrical post for use with a pool will be readily apparent to those of ordinary skill in the art upon reading the following detailed description of the presently preferred, but nonetheless illustrative, embodiments when taken in conjunction with the accompanying drawings.

In this respect, before explaining the current embodiments of the electrical post for use with a pool in detail, it is to be understood that the electrical post for use with a pool is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the electrical post for use with a pool.

It is therefore important that the claims be regarded as including such equivalent construction insofar as they do not depart from the spirit and scope of the electrical post for use with a pool. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description. As used herein, the word "or" is intended to be inclusive.

Figure 1:
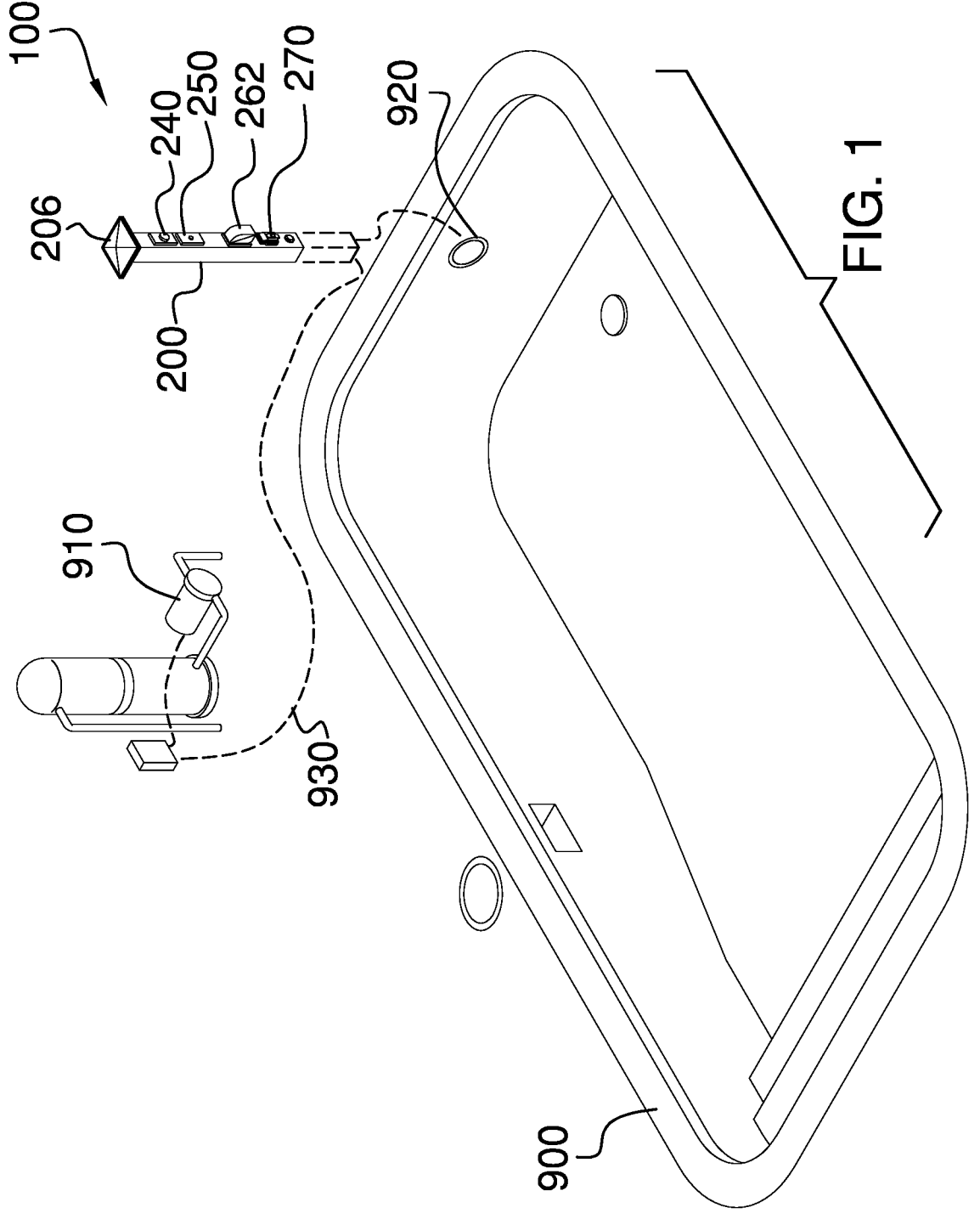
FIG. 1 is an isometric in-use view of an embodiment of the disclosure.
Figure 2:
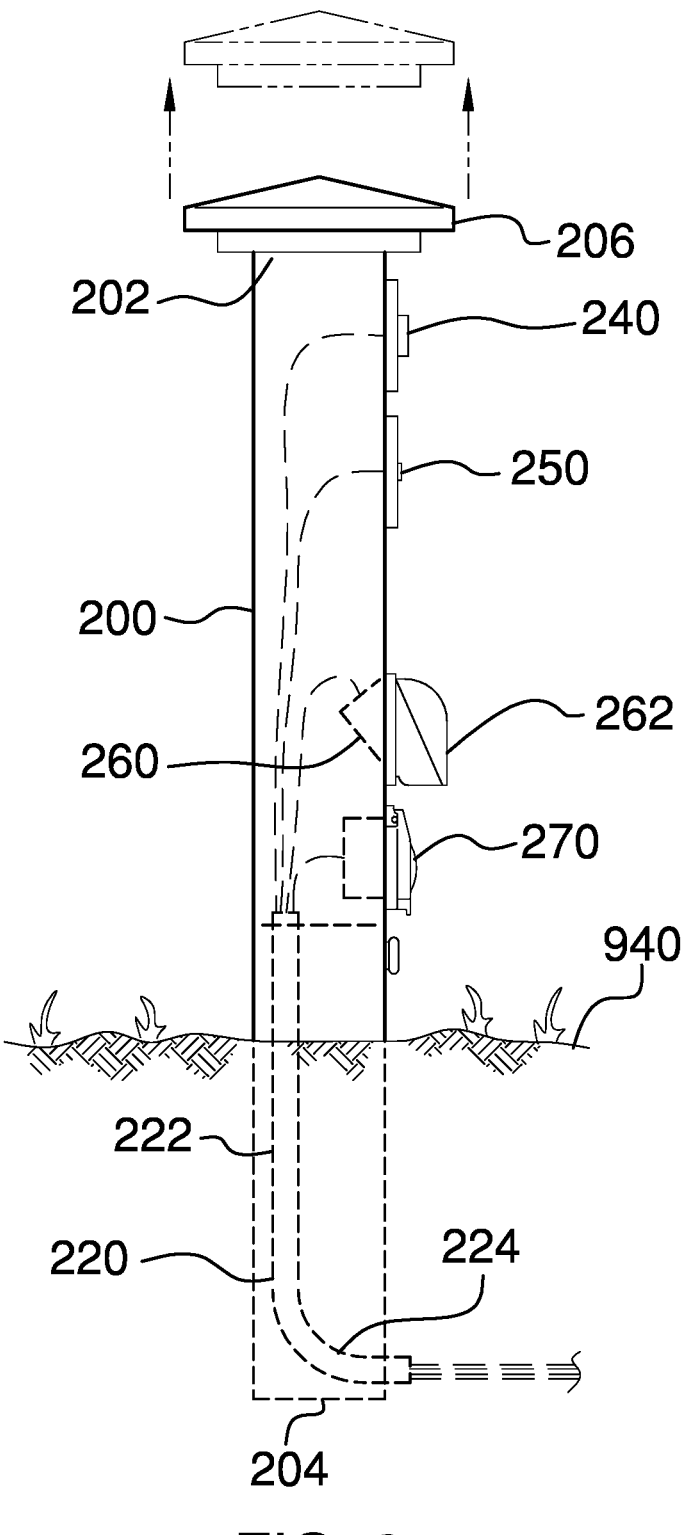
FIG. 2 is a side view of an embodiment of the disclosure.
Figure 3:
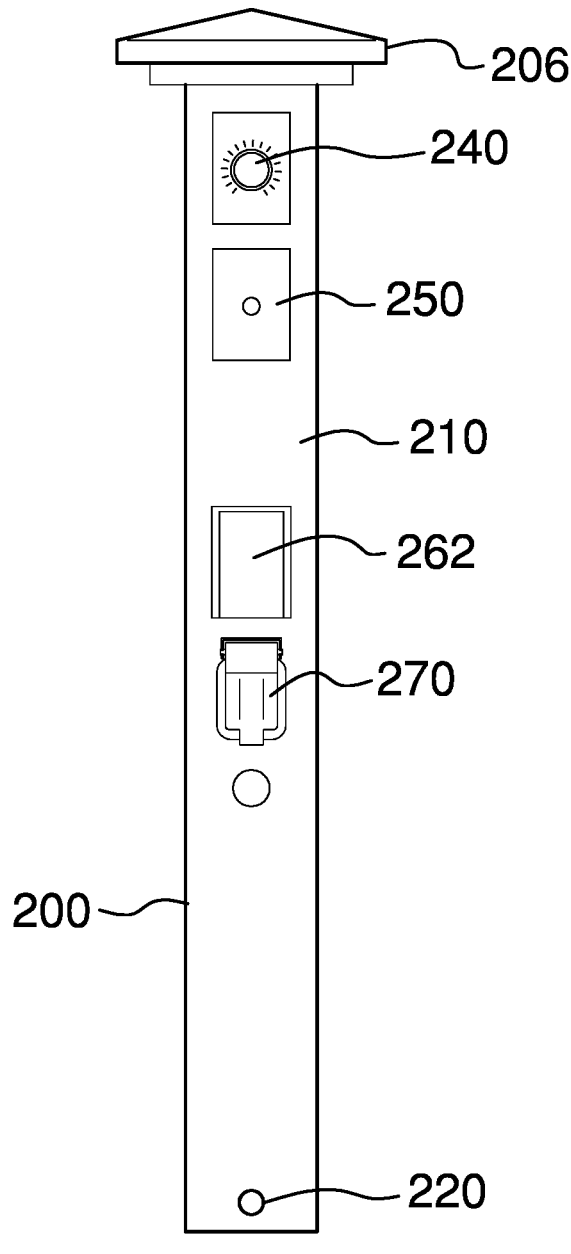
FIG. 3 is a front view of an embodiment of the disclosure.
Figure 4:
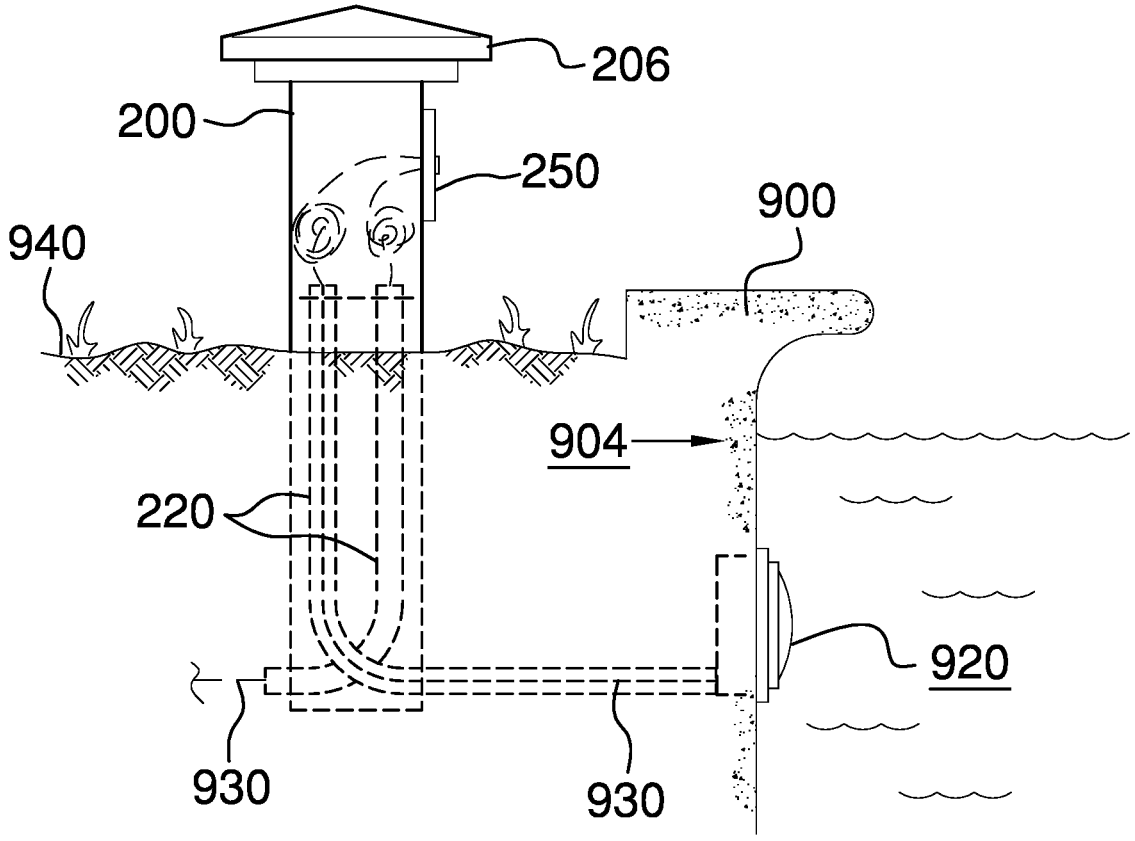
FIG. 4 is a side view of an alternative embodiment of the disclosure, illustrating a reduced size post and a subset of the features.
Figure 5:
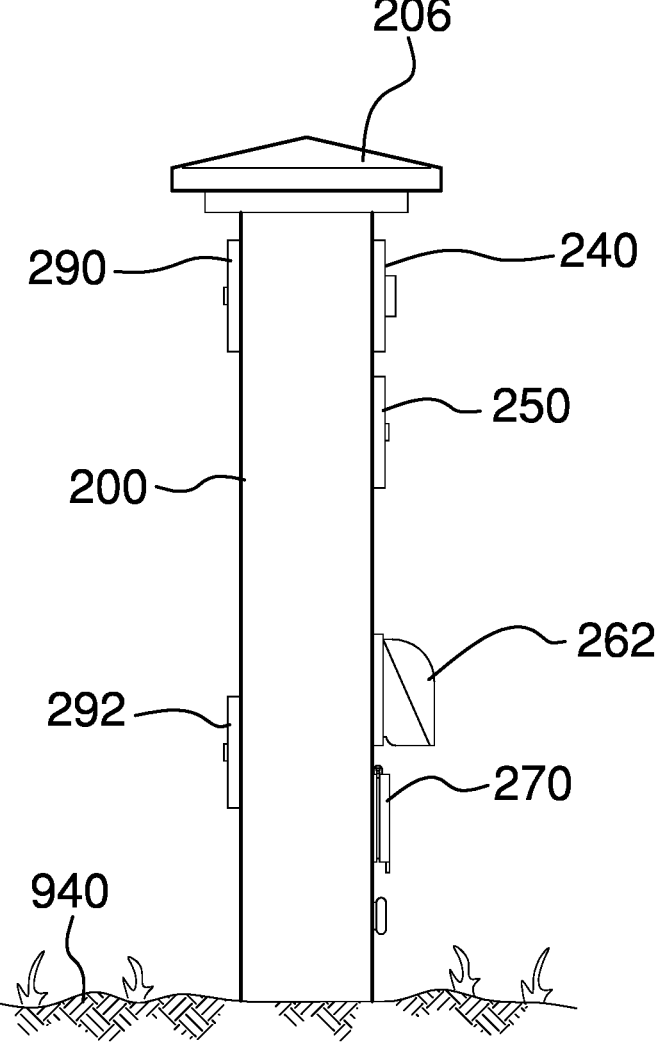
FIG. 5 is a side view of an alternative embodiment of the disclosure, illustrating the inclusion of a heater control and a heater breaker.
Figure 6:
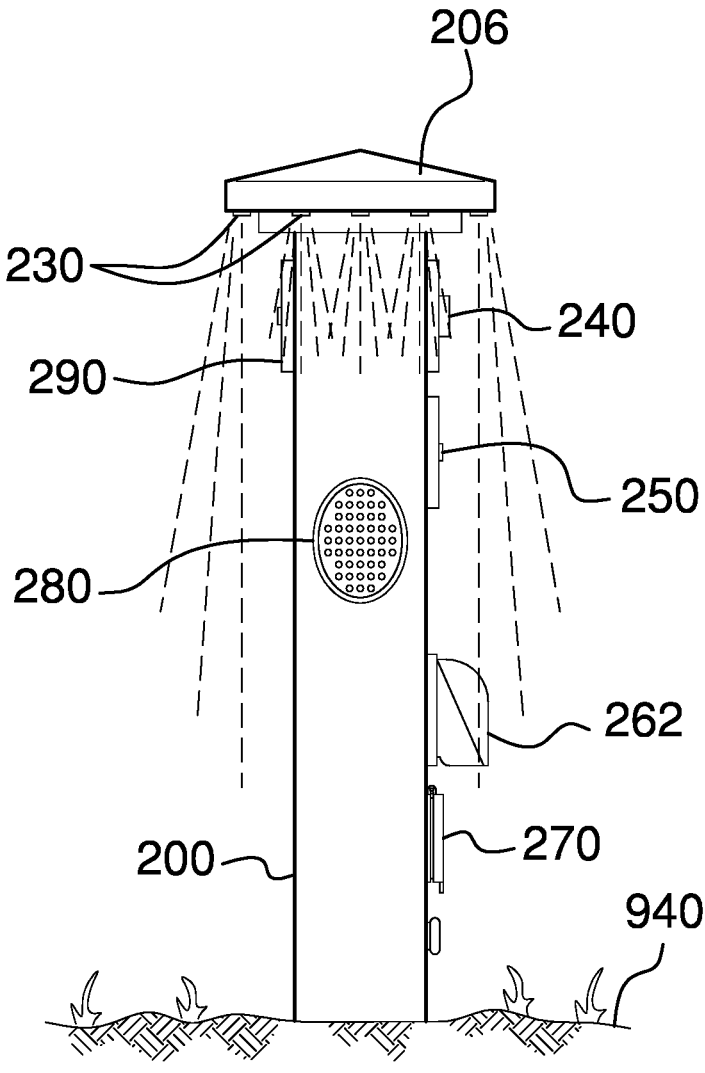
FIG. 6 is a side view of an alternative embodiment of the disclosure, illustrating the inclusion of a watertight speaker and a plurality of lights in the removable top cap.
Figure 7:
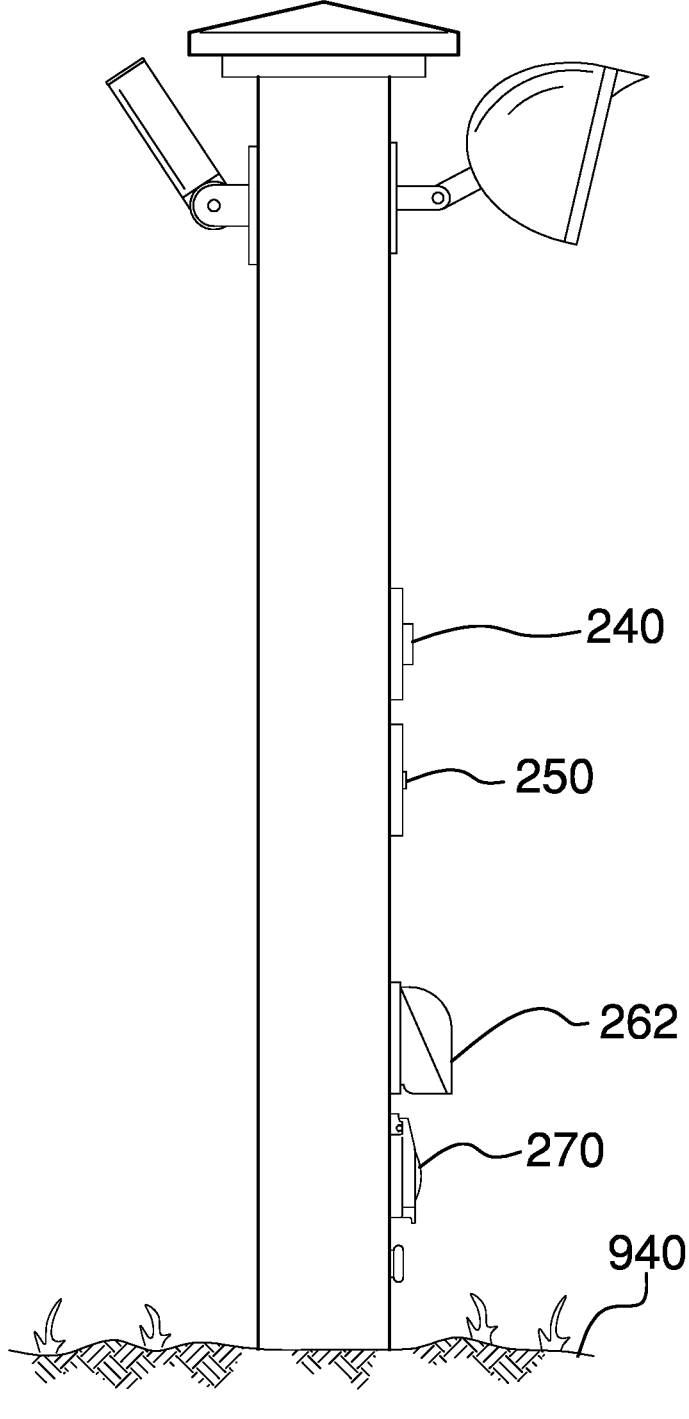
FIG. 7 is a side view of an alternative embodiment.

Detailed reference will now be made to a first potential embodiment of the disclosure, which is illustrated in FIGS. 1 through 7.

The electrical post for use with a pool 100 (hereinafter invention) comprises an enclosure 200, a control switch 250, a timer 240, an AC outlet 260, and a GFCI breaker 270. The invention 100 may be configured for use with a swimming pool 900, pool equipment, or both. As non-limiting examples, the pool equipment may comprise a pool pump 910, one or more pool lights 920, a pool heater, an outdoor audio system, a pool safety alarm, a device plugged into the AC outlet 260, or any combination thereof. The enclosure 200 may be a square post rising from the ground and electrically coupled to the pool equipment. Some of the pool equipment may be coupled to the enclosure 200 via underground wiring 930. The timer 240, the control switch 250, the AC outlet 260, and the GFCI breaker 270 may be mounted to side walls 210 of the enclosure 200 and may be accessible from outside of the enclosure 200.

Through this document, references to the ground are intended to include any ground level surface surrounding a pool. As non-limiting examples, the ground may comprise paved and unpaved surfaces, grassy areas, areas covered by ground cover plants, areas covered by stone or mulch, exposed sand, clay, or soil, and pool decks regardless of construction materials such as concrete, wood, composite materials, tiles, rubberized surfaces, or pavers.

The enclosure 200 may be a hollow, square post. The enclosure 200 may comprise an open top 202 that may be covered by a removable top cap 206. The enclosure 200 may comprise an open bottom 204 such that any rainwater or melting snow that finds its way into the enclosure 200 may drain through the open bottom 204. In some embodiments, the bottom end of the enclosure 200 may be buried to a depth of at least 18 inches.

One or more conduits 220 may be coupled to the enclosure 200 such that the underground wiring 930 may be routed into the enclosure 200 via the one or more conduits 220. As non-limiting examples, the underground wiring 930 passing through the one or more conduits 220 may electrically couple the invention 100 to the pool equipment and/or to an AC power source. An individual conduit selected from the one or more conduits 220 may comprise a vertical portion 222 and a sweep 224. The vertical portion 222 may be a vertically oriented conduit. The sweep 224 may be a curved portion of conduit. The top of the sweep 224 may be coupled to the bottom of the vertical portion 222. The bottom end of the sweep 224 may pass through one of the side walls 210 such that the underground wiring 930 may pass from outside of the enclosure 200 into the enclosure 200 via the individual conduit.

In a preferred embodiment, the one or more conduits 220 may be 1 inch diameter PVC pipe, ½ inch diameter PVC pipe, ¾ inch diameter PVC pipe, or any combination thereof. The top of the vertical portion 222 may extend upwards to a height that is at least 4 inches above ground level 940 and at least 8 inches above a maximum water level 904.

In some embodiments, the removable top cap 206 may comprise a plurality of lights 230. The plurality of lights 230 may be positioned around the periphery of the removable top cap 206 and may point downwards.

The control switch 250 may control the application of AC power to a subset of the pool equipment, to the timer 240, to the plurality of lights 230, to the AC outlet 260, or to any combination thereof. The control switch 250 may apply power when the control switch 250 is in an ON position and may remove power when the control switch 250 is in an OFF position.

The timer 240 may control the timing of power cycles applied to the subset of the pool equipment, to the plurality of lights 230, to the AC outlet 260, or to any combination thereof, collectively known as timed equipment. The timer 240 may control the frequency of the power cycles, the duration of the power cycles, or both. In some embodiments, the timer 240 may comprise a setting that disables the timer 240 and removes power from the timed equipment.

The AC outlet 260 may provide a pluggable interface for a plugged-in device to receive AC power. The AC outlet 260 may comprise a twist-lock connection. The AC outlet 260 may be oriented at a 45 degree+/−5 degree downward angle and may be covered by an outlet cover 262 that extends downward over the AC outlet 260 at a 45 degree+/−5 degree angle.

The GFCI breaker 270 may be a circuit breaker comprising a ground-fault circuit interrupter. The GFCI breaker 270 may be adapted to protect a user from electrical shock by sensing any leakage current that may be passing through the user and interrupting an electrical circuit in the presence of such a leakage current of 5 mA+/−1 mA or more. As a non-limiting example, the electrical circuit from the AC power source may pass through the GFCI breaker 270 before continuing on to power the subset of the pool equipment, the timer 240, the plurality of lights 230, the AC outlet 260, or any combination thereof.

In some embodiments, the invention 100 may house a waterproof speaker 280. The waterproof speaker 280 may be mounted on one of the side walls 210 of the enclosure 200 such that audio produced by the waterproof speaker 280 is audible outside of the enclosure 200. The waterproof speaker 280 may receive the audio stream to play via a wireless connection. In some embodiments, the audio stream may be music. In some embodiments, the audio stream may be an alert sound from the pool safety alarm.

In some embodiments, the invention 100 may comprise a heater control 290. The heater control 290 may be adapted for the user to establish a temperature set point for the pool heater. In some embodiments, the invention 100 may comprise a heater breaker 292. The heater breaker 292 may be a circuit breaker that may protect the pool heater from damage due to overcurrent or short circuit.

In a preferred embodiment, the control switch 250 may control at least the pool pump 910 and the plurality of lights 230, the timer 240 may control at least the pool pump 910 and the plurality of lights 230, and the control switch 250 may override the timer 240 in the sense that the control switch 250 may remove power from the timer 240.

Definitions

Unless otherwise stated, the words "up", "down", "top", "bottom", "upper", and "lower" should be interpreted within a gravitational framework. "Down" is the direction that gravity would pull an object. "Up" is the opposite of "down". "Bottom" is the part of an object that is down farther than any other part of the object. "Top" is the part of an object that is up farther than any other part of the object. "Upper" may refer to top and "lower" may refer to the bottom. As a non-limiting example, the upper end of a vertical shaft is the top end of the vertical shaft.

As used in this disclosure, "AC" may be an acronym for alternating current.

As used in this disclosure, a "circuit breaker" may be a normally closed maintained switch that automatically actuates to an open position should a dangerous condition (such as overcurrent or ground fault) be detected.

As used in this disclosure, a "conduit" may be a tube, pipe or hose that is used to transport a fluid or a gas or is used to route, enclose, and protect permanently installed electrical cables.

As used herein, the words "control" or "controls" are intended to include any device which can cause the completion or interruption of an electrical circuit; non-limiting examples of controls include toggle switches, rocker switches, push button switches, rotary switches, electromechanical relays, solid state relays, touch sensitive interfaces and combinations thereof whether they are normally open, normally closed, momentary contact, latching contact, single pole, multi-pole, single throw, or multi-throw. In some embodiments, a control may alter an electrical property of a circuit such as resistance, inductance, or capacitance.

As used herein, the words "couple", "couples", "coupled" or "coupling", may refer to connecting, either directly or indirectly, and does not necessarily imply a mechanical connection.

As used in this disclosure, a "diameter" of an object is a straight line segment that passes through the center (or center axis) of an object. The line segment of the diameter is terminated at the perimeter or boundary of the object through which the line segment of the diameter runs.

As used in this disclosure, "frequency" may be a count of the number of repetitions of a cyclic process has been completed within a set period of time.

As used in this disclosure, a "pump" may be a mechanical or electromechanical device that uses suction or pressure to raise or move fluids, compress fluids, or force a fluid into an inflatable object. As non-limiting examples, fluids may include both liquids, such as water, and gases, such as air.

As used in this disclosure, a "speaker" may be an electrical transducer that converts an electrical signal into an audible sound; also known as a loudspeaker.

As used herein, "subset" may refer to a relationship between two sets. Set 'A' may be said to be a subset of set 'B' if all elements of set 'A' are also elements of set 'B'. The definition of subset allows that the membership of set 'A' may equal the membership of set 'B'. A subset may also be an empty set, meaning that the subset may have no members.

As used in this disclosure, a "switch" may be an electrical device that starts and stops the flow of electricity through an electric circuit by completing or interrupting an electric circuit. The act of completing or interrupting the electrical circuit may be called actuation. Completing or interrupting an electric circuit with a switch is often referred to as closing or opening a switch, respectively. Completing or interrupting an electric circuit is also referred to as making or breaking the circuit, respectively.

As used in this disclosure, "vertical" may refer to a direction that is parallel to the local force of gravity. Unless specifically noted in this disclosure, the vertical direction is always perpendicular to horizontal.

As used herein, the word "waterproof" may refer to an object that is not harmed when being exposed to water, including total submersion for a period of time. When used as a verb, "waterproof" may refer to taking steps to make an object waterproof. Non-limiting examples of such steps may include applying special coatings or using gaskets to seal seams and entry points of an enclosure.

Throughout this document references to "wire", "wires", "wired", or "wiring" may describe and/or show a single conductor when, in fact, two conductors may be required to power or control a subsystem; a convention used herein is that the common return conductor to which all electrical subsystems are connected may not be shown in order to clarify the figures. This common return conductor is a continuous electrical path and does not pass through any type of switch or other electrical component other than the possibility of passing through one or more connectors.

As used in this disclosure, "wireless" may be an adjective that is used to describe a communication channel that does not require the use of physical cabling.

With respect to the above description, it is to be realized that the optimum dimensional relationship for the various components of the invention described above and in FIGS. 1 through 7, include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

What is claimed is:

1. An electrical post for use with a pool comprising:
an enclosure, a control switch, a timer, an AC outlet, and a GFCI breaker;
wherein the electrical post for use with a pool is configured for use with a swimming pool, pool equipment, or both;
wherein the enclosure is a square post rising from the ground and electrically coupled to the pool equipment;
wherein the timer, the control switch, the AC outlet, and the GFCI breaker are mounted to side walls of the enclosure and are accessible from outside of the enclosure;
wherein the enclosure comprises an open top that is covered by a removable top cap;
wherein the enclosure comprises an open bottom;
wherein the control switch controls the application of AC power to a subset of the pool equipment, to the timer, to the plurality of lights, to the AC outlet, or to any combination thereof;
wherein the electrical post for use with a pool houses a waterproof speaker;
wherein the electrical post for use with a pool comprises a heater control.

2. The electrical post for use with a pool according to claim 1 wherein the enclosure is a hollow, square post.

3. The electrical post for use with a pool according to claim 2
wherein the bottom end of the enclosure is buried to a depth of at least 18 inches.

4. The electrical post for use with a pool according to claim 2
wherein one or more conduits are coupled to the enclosure such that underground wiring is routed into the enclosure via the one or more conduits;
wherein an individual conduit selected from the one or more conduits comprises a vertical portion and a sweep;
wherein the vertical portion is a vertically oriented conduit;
wherein the sweep is a curved portion of conduit;
wherein the top of the sweep is coupled to the bottom of the vertical portion;
wherein the bottom end of the sweep passes through one of the side walls such that the underground wiring passes from outside of the enclosure into the enclosure via the individual conduit.

5. The electrical post for use with a pool according to claim 4
wherein the one or more conduits are 1 inch diameter PVC pipe, ½ inch diameter PVC pipe, ¾ inch diameter PVC pipe, or any combination thereof;
wherein the top of the vertical portion extends upwards to a height that is at least inches above ground level and at least 8 inches above a maximum water level.

6. The electrical post for use with a pool according to claim 4 wherein the removable top cap comprises a plurality of lights;

wherein the plurality of lights are positioned around the periphery of the removable top cap and point downwards.

7. The electrical post for use with a pool according to claim 6 wherein the control switch applies power when the control switch is in an ON position and removes power when the control switch is in an OFF position.

8. The electrical post for use with a pool according to claim 7 wherein the timer controls the timing of power cycles applied to the subset of the pool equipment, to the plurality of lights, to the AC outlet, or to any combination thereof, collectively known as timed equipment;

wherein the timer controls the frequency of the power cycles, the duration of the power cycles, or both.

9. The electrical post for use with a pool according to claim 8 wherein the timer comprises a setting that disables the timer and removes power from the timed equipment.

10. The electrical post for use with a pool according to claim 8 wherein the AC outlet provides a pluggable interface for a plugged-in device to receive AC power;

wherein the AC outlet comprises a twist-lock connection.

11. The electrical post for use with a pool according to claim 10 wherein the AC outlet is oriented at a 45 degree+/−5 degree downward angle and is covered by an outlet cover that extends downward over the AC outlet at a degree+/−5 degree angle.

12. The electrical post for use with a pool according to claim 11 wherein the GFCI breaker is a circuit breaker comprising a ground-fault circuit interrupter;

wherein the GFCI breaker is adapted to protect a user from electrical shock by sensing any leakage current that is passing through the user and interrupting an electrical circuit in the presence of such a leakage current of 5 mA+/−1 mA or more.

13. The electrical post for use with a pool according to claim 12 wherein the electrical circuit from the AC power source passes through the GFCI breaker before continuing on to power the subset of the pool equipment, the timer, the plurality of lights, the AC outlet, or any combination thereof.

14. The electrical post for use with a pool according to claim 12 wherein the waterproof speaker is mounted on one of the side walls of the enclosure such that audio produced by the waterproof speaker is audible outside of the enclosure.

15. The electrical post for use with a pool according to claim 14 wherein the waterproof speaker receives the audio stream to play via a wireless connection.

16. The electrical post for use with a pool according to claim 15 wherein the audio stream is music.

17. The electrical post for use with a pool according to claim 15 wherein the audio stream is an alert sound from a pool safety alarm.

18. The electrical post for use with a pool according to claim 14 wherein the heater control is adapted for the user to establish a temperature set point for a pool heater.

19. The electrical post for use with a pool according to claim 18 wherein the electrical post for use with a pool comprises a heater breaker;

wherein the heater breaker is a circuit breaker that protects the pool heater from damage due to overcurrent.

20. The electrical post for use with a pool according to claim 19 wherein the control switch controls at least a pool pump and the plurality of lights, the timer controls at least the pool pump and the plurality of lights, and the control switch overrides the timer in the sense that the control switch removes power from the timer.

* * * * *